(12) United States Patent
Kumano et al.

(10) Patent No.: US 11,309,918 B2
(45) Date of Patent: Apr. 19, 2022

(54) MEMORY SYSTEM

(71) Applicant: KIOXIA CORPORATION, Tokyo (JP)

(72) Inventors: Yuta Kumano, Kawasaki Kanagawa (JP); Hironori Uchikawa, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/005,282

(22) Filed: Aug. 27, 2020

(65) Prior Publication Data

US 2021/0273655 A1 Sep. 2, 2021

(30) Foreign Application Priority Data

Mar. 2, 2020 (JP) .............................. JP2020-035203

(51) Int. Cl.
*H03M 13/00* (2006.01)
*H03M 13/15* (2006.01)
*G06F 11/07* (2006.01)
*H03M 13/11* (2006.01)

(52) U.S. Cl.
CPC ..... *H03M 13/1585* (2013.01); *G06F 11/0787* (2013.01); *H03M 13/1105* (2013.01); *H03M 13/1148* (2013.01); *H03M 13/152* (2013.01); *H03M 13/1515* (2013.01)

(58) Field of Classification Search
None
See application file for complete search history.

(56) References Cited

U.S. PATENT DOCUMENTS

| | | | |
|---|---|---|---|
| 9,553,612 B2 | 1/2017 | Bolotov et al. | |
| 9,778,985 B1* | 10/2017 | Kim | G06F 3/064 |
| 10,574,272 B2 | 2/2020 | Kumano et al. | |
| 2008/0215955 A1* | 9/2008 | Kimbara | G06F 11/1008 714/768 |
| 2010/0253555 A1* | 10/2010 | Weingarten | H03M 13/2906 341/51 |

(Continued)

FOREIGN PATENT DOCUMENTS

| | | |
|---|---|---|
| EP | 3457575 A1 | 3/2019 |
| JP | 2019057752 A | 4/2019 |
| JP | 2019517209 A | 6/2019 |

*Primary Examiner* — Mujtaba M Chaudry
(74) *Attorney, Agent, or Firm* — Kim & Stewart LLP

(57) ABSTRACT

A memory system includes a nonvolatile memory and a memory controller. The nonvolatile memory stores a multidimensional error correction code in which each of a plurality of symbol groups is encoded by both a first component code and a second component code. The memory controller reads the error correction code from the nonvolatile memory, executes a first decoding process using the first component code and the second component code, and when the first decoding process fails, executes a second decoding process on an error symbol group. The second decoding process includes a process of selecting the positions of a plurality of symbols whose values included in the error symbol group are to be inverted according to a decision rule. The decision rule includes a rule for cyclically shifting a position selected for the second decoding process at to decide the position for the second decoding process at the next time.

15 Claims, 11 Drawing Sheets

(56) References Cited

U.S. PATENT DOCUMENTS

| | | | |
|---|---|---|---|
| 2013/0238959 A1* | 9/2013 | Birk | G11C 16/3427 |
| | | | 714/773 |
| 2014/0136927 A1* | 5/2014 | Li | G06F 11/1068 |
| | | | 714/768 |
| 2016/0246673 A1* | 8/2016 | Kim | H03M 13/1575 |
| 2018/0278273 A1* | 9/2018 | Kifune | G11C 29/52 |
| 2019/0089384 A1 | 3/2019 | Kumano et al. | |

* cited by examiner

FIG. 10

|   |   |   |   |   |   |   |   |   |
|---|---|---|---|---|---|---|---|---|
| 1 |   |   |   | 1 |   |   | 1 |   |
|   | 1 |   |   |   | 1 |   |   | 1 |
| 1 |   | 1 |   |   |   | 1 |   |   |
|   | 1 |   | 1 |   |   |   | 1 |   |
|   |   | 1 |   | 1 |   |   |   | 1 |
| 1 |   |   |   | 1 |   | 1 |   |   |
|   | 1 |   |   |   | 1 |   | 1 |   |
|   |   | 1 |   |   |   | 1 |   | 1 |
|   |   |   | 1 |   |   | 1 |   | 1 |

MEMORY SYSTEM

CROSS-REFERENCE TO RELATED APPLICATION(S)

This application is based upon and claims the benefit of priority from Japanese Patent Application No. 2020-035203, filed Mar. 2, 2020, the entire contents of which are incorporated herein by reference.

FIELD

Embodiments described herein relate generally to a memory system.

BACKGROUND

In a memory system, error correction coded data is typically stored to protect stored data. Therefore, when reading the data stored in the memory system, the error correction coded data must be decoded.

BRIEF DESCRIPTION OF THE DRAWINGS

FIG. 10 depicts an example of a generated parity check matrix.

DETAILED DESCRIPTION

In general, according to one embodiment, a memory system includes a nonvolatile memory and a memory controller. The nonvolatile memory stores a multidimensional error correction code in which each of a plurality of symbol groups is encoded using both a first component code and a second component code. The memory controller reads the multidimensional error correction code from the nonvolatile memory, executes a first decoding process using the first component code and the second component code, and when the first decoding process fails, executes a second decoding process on an error symbol group. The second decoding process includes a process of determining the positions of a plurality of symbols whose values in the error symbol group are to be inverted according to a predetermined decision rule. The second decoding process also including inverting the values of the symbols at the determined positions and performing a decoding process using at least one of the first component code and the second component code after the values are inverted. The predetermined decision rule includes a rule for cyclically shifting a position selected for the second decoding process at one time to select the position for the second decoding process at the next time.

Hereinafter, memory systems according to certain example embodiments of the present disclosure will be described with reference to the accompanying drawings. The present disclosure is not limited to these example embodiments.

First Embodiment

Figure 1:
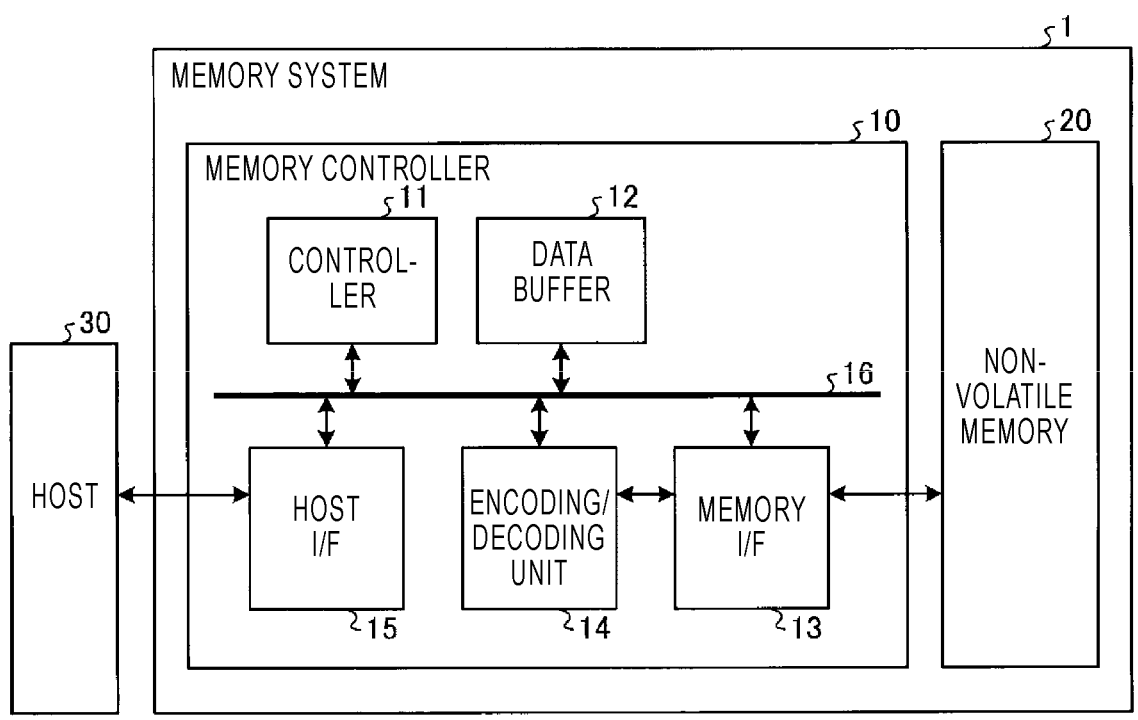
FIG. 1 is a block diagram of a memory system according to a first embodiment.

FIG. 1 is a block diagram illustrating an example of a schematic configuration of a memory system according to a first embodiment. As illustrated in FIG. 1, the memory system 1 includes a memory controller 10 and a nonvolatile memory 20. The memory system 1 may be connected to a host 30. FIG. 1 illustrates a state in which the memory system 1 is connected to the host 30. The host 30 may be, for example, an electronic device such as a personal computer or a mobile terminal.

The nonvolatile memory 20 stores data in a nonvolatile manner, and is, for example, a NAND flash memory (hereinafter, simply referred to as a NAND memory). In the following description, a case where a NAND memory is used as the nonvolatile memory 20 is illustrated, but a storage type other than the NAND memory, such as a three-dimensional structure flash memory, a ReRAM (Resistance Random Access Memory), an FeRAM (Ferroelectric Random. Access Memory) or the like, may be used in other example. Further, the nonvolatile memory 20 need not necessarily be a semiconductor type memory, and the present embodiment may be applied to various storage media other than semiconductor memory.

The memory system 1 may be a memory card or the like in which the memory controller 10 and the nonvolatile memory 20 are configured as one package, or may be an SSD (Solid State Drive) or the like.

The memory controller 10 is, for example, a semiconductor integrated circuit configured as a SoC (System-On-a-Chip). Some or all of the operation of each component of the memory controller 10 to be described below may be implemented as a CPU (Central Processing Unit) executing firmware, or may be implemented as dedicated hardware or the like.

The memory controller 10 controls writing of data to the nonvolatile memory 20 according to a write request from the host 30. The memory controller 10 also controls reading of data from the nonvolatile memory 20 according to a read request from the host 30. The memory controller 10 includes a host interface (I/F) 15, a memory I/F interface (I/F) 13, a controller 11, an encoding/decoding unit 14 (also referred to as a codec), and a data buffer 12. The host I/F 15, the memory I/F 13, the controller 11, the encoding/decoding unit 14, and the data buffer 12 are interconnected by an internal bus 16.

The host I/F 15 performs a process according to an interface standard with the host 30, and outputs a request received from the host 30, user data to be written and others to the internal bus 16. In addition, the host I/F 15 transmits user data read and/or restored from the nonvolatile memory 20, a response from the controller 11 and others to the host 30.

The memory I/F 13 performs a write operation for the nonvolatile memory 20 based on an instruction from the controller 11. The memory I/F 13 also performs a process of reading data from the nonvolatile memory 20 based on an instruction from the controller 11.

The data buffer 12 temporarily stores the user data received from the host 30 by the memory controller 10 until the received user data is stored in the nonvolatile memory 20. The data buffer 12 also temporarily stores the user data read from the nonvolatile memory 20 until the read user data is transmitted to the host 30. As the data buffer 12, for example, a general-purpose memory such as an SRAM (Static Random. Access Memory) or a DRAM (Dynamic Random Access Memory) may be used.

The controller 11 collectively controls the respective components of the memory system 1. When a request is received from the host 30 via the host I/F 15, the controller 11 performs a control according to the request. For example, the controller 11 instructs the memory I/F 13 to write the user data and parity information (bits) to the nonvolatile memory 20 in response to a write request from the host 30. The controller 11 also instructs the memory I/F 13 to read the user data and parity information from the nonvolatile memory 20 in response to a read request from the host 30.

When a user data write request is received from the host 30, the controller 11 determines a storage area (memory area or memory address) on the nonvolatile memory 20 for the user data stored in the data buffer 12. That is, the controller 11 manages the write destination of the user data. The correspondence between a logical address of the user data received from the host 30 and a physical address of the storage area in the nonvolatile memory 20 in which the user data is stored, for example, the data buffer 12 as an address translation table (logical-to-physical conversion table of the like).

Further, when a read request is received from the host 30, the controller 11 uses the address translation table to translate a logical address designated by the read request into a physical address, and instructs the memory I/F 13 to read from the physical address.

Here, in a NAND memory, writing and reading are generally performed in units of data called a page, and erasing is performed in units of predetermined data size larger than a page. In this embodiment, a plurality of memory cells connected to the same word line is called a memory cell group. When the memory cells are single level cells (SLCs), one memory cell group corresponds to one page. When the memory cells are multi-level cells (MLCs), one memory cell group corresponds to a plurality of pages. Each memory cell is connected to a word line and also to a bit line. Therefore, each memory cell may be uniquely identified by an address that identifies a particular word line and an address that identifies a particular bit line.

For example, when a memory cell is a memory cell of 2-bit/cell, a 2-bit data value is associated with each of four threshold voltage distributions of Er, A, B, and C states. This association is called a data coding. The data coding method is predetermined. At the time of data writing (programming), charges are injected into the memory cell such that the memory cell reaches a state (threshold voltage distribution) that corresponds to a data value stored according to the data coding. In addition, when 2-bits/cell is used, one memory cell group corresponds to two pages. The two bits that may be stored in each memory cell correspond to two different pages, respectively. Hereinafter, these two pages will be referred to as a lower page and an upper page.

The user data transmitted from the host 30 is transferred to the internal bus 16 and temporarily stored in the data buffer 12. The encoding/decoding unit 14 encodes the user data to be stored in the nonvolatile memory 20 with an error correction code to generate encoded data (also referred to as a code word or coded word). The encoding/decoding unit 14 also decodes the encoded data (also referred to as read information or a received word) read from the nonvolatile memory 20 to restore the user data. The data encoded by the encoding/decoding unit 14 may include control data or the like used inside the memory controller 10, in addition to the user data.

In the write operation executed in the memory system 1 having the configuration described above, the controller 11 instructs the encoding/decoding unit 14 to encode the user data when writing is executed to the nonvolatile memory 20. At this time, the controller 11 determines a storage location (storage address) of a code word in the nonvolatile memory 20, and also indicates the determined storage location to the memory I/F 13. The encoding/decoding unit 14 encodes the user data on the data buffer 12 with an error correction code, based on an instruction from the controller 11, to generate a code word. As for the encoding method, for example, an encoding method using an LDPC (Low-Density Parity-Check) code, a BCH (Bose-Chaudhuri-Hocquenghem) code, or an RS (Reed-Solomon) code may be adopted. The memory I/F 13 writes the code word to the nonvolatile memory 20 based on an instruction from the controller 11.

In the read operation, when reading from the nonvolatile memory 20 is executed, the controller 11 designates an address on the nonvolatile memory 20 and instructs the memory I/F 13 to execute the reading. The controller 11 also instructs the encoding/decoding unit 14 to start the decoding. The memory I/F 13 executes the reading for the designated address of the nonvolatile memory 20 according to an instruction of the controller 11, and inputs the read information obtained by the reading to the encoding/decoding unit 14. Then, the encoding/decoding unit 14 decodes the input read information.

The encoding/decoding unit 14 may also be used, for example, as an encoding unit/decoding unit for each component code of a multidimensional error correction code. Here, a multidimensional error correction code refers to a symbol being repeatedly encoded by a plurality of smaller component codes. In this context, one symbol is, for example, one bit (element of a binary field) or an alphabet element such as a finite field other than the binary field. Such a multidimensional error correction code can be product codes, graph codes which are concept generalizing product codes, and generalized LDPC codes (Generalized Low-Density Parity Check Codes), which are a concept further generalizing graph codes.

Figure 2:
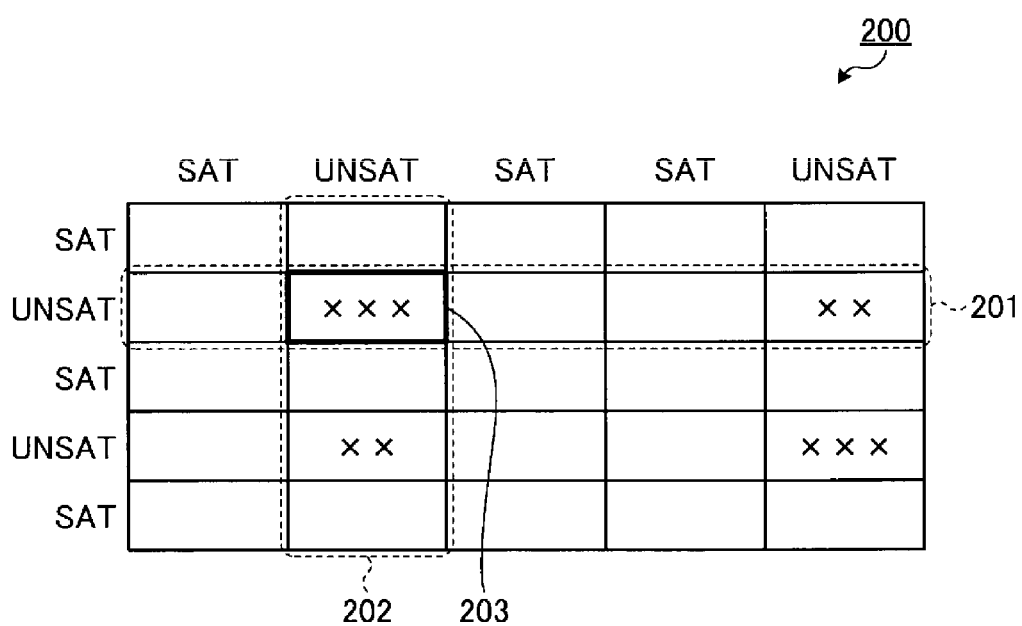
FIG. 2 depicts aspects related to a multidimensional error correction code according to a first embodiment.

FIG. 2 illustrates an example of a configuration of a product code 200 as an example of the multidimensional error correction code. The product code 200 is an example of a product code using a BCH code capable of correcting 3 bits as a row direction component code (an example of a first component code) and a column direction component code (an example of a second component code). The product code 200 is an example of a two-dimensional block product code that includes five blocks in each of the row direction and the column direction. Each block includes a plurality of symbols that makes up a code. Each block corresponds to a symbol group that is a set of a plurality of symbols that makes up a code.

The number of blocks in the row and column directions is not limited to five. Furthermore, as the component code, any code other than BCH may be used. For example, a Reed-Solomon code may be used as the component code in at least one of the row direction and the column direction.

In the decoding of the product code illustrated in FIG. 2, the encoding/decoding unit 14 first sequentially decodes the row direction component codes that form the product code. The encoding/decoding unit 14 decodes the component code by, for example, limit distance decoding. When there is a component code that does not succeed in decoding among the component codes in the row direction, the encoding/decoding unit 14 corrects the errors that can be corrected in the decoding of the component code in the row direction, and then decodes the component code in the column direction. When there is a component code that does not succeed in decoding among the component codes in the column direction, the encoding/decoding unit 14 corrects the errors that can be corrected in the decoding of the component code in the column direction, and again decodes the component code in the row direction. As described above, the decoding of the component code in the row direction and the decoding of the component code in the column direction are repeatedly executed until some end condition is satisfied. Hereinafter, the repeated decoding in this way may be referred to as an iterative decoding process. The product code is used to implement an encoding method having a high correction capability and a small calculation amount.

The multidimensional error correction code is not limited to the product code 200 illustrated in FIG. 2, and may be, for example, a generalized low density parity check code (LDPC) code. In a general multidimensional error correction code including a generalized LDPC code, the protection duplicity may differ for each symbol. Furthermore, in the general multidimensional error correction code, there is a case where the component codes might not be grouped in the row direction and the column direction, but the present technology may still be applied to the multidimensional error correction code having such a code structure. A case where a block product code is used as the multidimensional error correction code will be described below as an example.

In the block product code, a plurality of symbols (e.g., bits) is allocated to each block. Therefore, when a number of errors occur within one block, the errors might not be corrected even though decoding in the row direction and the column direction is repeated, and an error floor occurs.

FIG. 2 illustrates an example of a state in which an error remains after the iterative decoding process. The notation "x" in FIG. 2 represents a symbol having an error in a block. Whether or not there is an error in each component code may be determined by, for example, whether a syndrome is 0 (no error) or not (error). In FIG. 2, "SAT" represents a component code determined to have no error, and "UNSAT" represents a component code determined to have an error. The depicted block 203 corresponds to an intersection of a component code 201 in the row direction and a component code 202 in the column direction, and is an example of a block including a number of errors.

In the present embodiment, when there is a block including a number of errors, the value of the symbol in this block is inverted (flipped) to perform decoding. As such a technique, for example, Multi-Bit Flip Decoding (MBFD) may be applied. Details of the encoding/decoding unit 14 that performs such decoding will be described below.

Figure 3:
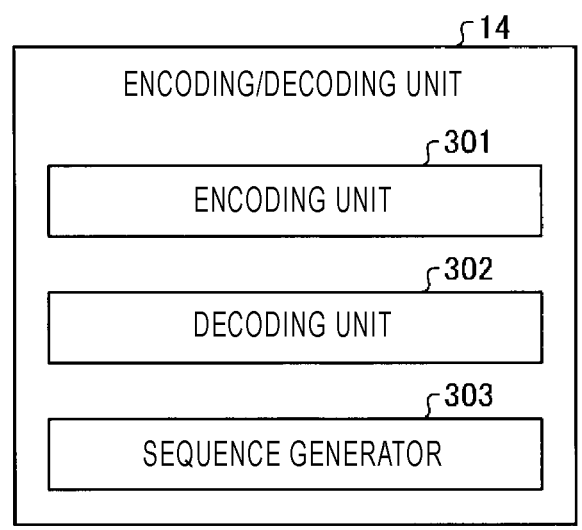
FIG. 3 is a block diagram of a functional configuration of an encoding/decoding unit according to a first embodiment.

FIG. 3 is a block diagram illustrating an example of the functional configuration of the encoding/decoding unit 14. FIG. 3 illustrates an example of a case where the two-dimensional product code as illustrated in FIG. 2 is encoded/decoded. A two-dimensional error correction code will be mainly described below as an example, but the same method may be applied to an N-dimensional (N is an integer of 2 or more) error correction code.

As illustrated in FIG. 3, the encoding/decoding unit 14 includes an encoding unit 301, a decoding unit 302, and a sequence generator 303. The coding unit 301 codes the component codes in the row direction and the column direction. The decoding unit 302 executes the iterative decoding process (a first decoding process) of the component code in the row direction and the component code in the column direction. In addition, the decoding unit 302 executes MBFD (an example of a second decoding process) for a component code including a block (an error symbol group) that is determined to include an error by both a component code in the row direction and a component code in the column direction when the iterative decoding process fails. The component code for executing MBFD may be one or both of the row direction component code and the column direction component code.

MBFD is executed in the following procedure.

(S1) A block included in both of the row direction component code where the syndrome is not 0 (UNSAT) and the column direction component code where the syndrome is not 0 (UNSAT) is the target block (a block at a UNSAT row-column intersection).

(S2) In the target block, a process of selecting a symbol to be flipped, flipping the selected symbol, and then decoding a component code is repeated until decoding is successful while changing the position of the symbol to be flipped (flip pattern).

(S3) When the decoding is not successful even though (S2) has been executed for all the flip patterns, the process of (S2) is executed with another block as the target block.

When the number of bits included in the target block is large, the number of combinations of symbols to be flipped (flip patterns) is large. Therefore, the time required for successful decoding may be lengthy. Therefore, in the present embodiment, the sequence generator 303 generates a sequence of data indicating a flip pattern so that the time until the decoding is successful may be shortened. Then, when executing the MBFD, the decoding unit 302 flips the symbol in the target block according to the flip pattern generated by the sequence generator 303.

When the number of correctable bits is t, the number of symbols (the symbol number I) included in the target block and the upper limit value fmax of the number of symbols to be flipped are determined so as to satisfy the relationship of I≥t+fmax.

The details of the flip pattern generating process by the sequence generator 303 will be described below. Generating a flip pattern is equivalent to determining the positions of a plurality of symbols to be flipped. The flip pattern may be represented as, for example, a binary sequence that includes the same number of elements (bits) as the symbol number included in the target block, where elements corresponding to the flip position is 1 and the other elements are 0. The flip pattern is not limited to a binary sequence and may be represented in any format as long as data may specify a flip position in the target block. For example, the flip pattern may be represented by an index sequence including a plurality of indexes that respectively identify symbols to be flipped.

The sequence generator 303 generates and outputs a flip pattern according to, for example, the following decision rules.

(R1) An initial value of a flip position is determined according to a rule for determining an initial value of the position of a flipped symbol in the flip pattern.

(R2) When decoding using the initial value fails, the flip position in the flip pattern used for the second and subsequent decoding is determined by a position obtained by cyclically shifting the initial value.

(R3) When the cyclically shifted position returns to the initial value, a new initial value (updated initial value) is determined.

The process of determining the initial value (R1 and R3 above) may be implemented by, for example, any of the following processes:

A list defining a plurality of initial values is stored in, for example, the data buffer 12, and an initial value to be used first and an updated initial value are acquired from this list.

An initial value is determined according to an update rule of the initial value.

The update rule may be executed by, for example, the following procedure. Hereinafter, a case where the number of symbols in the target block is n and the symbol number (weight) to be flipped is 2 will be described as an example.

An initial value to be used first (an initial value of the initial value) is set in advance. For example, an index sequence that is the initial value to be used first is set as (0, 1).

The index of an initial value before update is set as $(j_0, j_1)$, and the index of an initial value after update is set as $(k_0, k_1)$. The index after update is determined according to the following rule. However, the process ends when k1>n/2 (truncated).

$k_0 = j_0$ (that is, fixed to 0)

$k_1 = j_1 + 1$ (R2) may be executed by, for example, the following procedure.

A position is obtained by cyclically shifting the position determined for the m-th (m is an integer of 1 or more) decoding process in the target block.

The obtained position is compared with an initial value.

When the obtained position does not match the initial value, the obtained position is determined as a position for the (m+1)th decoding process.

When the obtained position matches the initial value, the process proceeds to (R3).

For example, when the symbol number (bit number) in the target block is 6, the symbol number to be flipped is 2, and the first initial value of the flip pattern is "110000", the flip pattern is generated as follows.
First time: "110000"
Second time: "011000"
Third time: "001100"
Fourth time: "000110"
Fifth time: "000011"
Sixth time: "100001"

At the seventh time, since the flip pattern after the cyclic shift matches the first flip pattern (initial value), the initial value is updated. For example, the initial value is updated to "101000". After that, a flip pattern is generated as follows based on the updated initial value.
Seventh time: "101000"
Eighth time: "010100"
Ninth time: "001010"
Tenth time: "000101"
Eleventh time: "100010"
Twelfth time: "010001"

In addition, in the above example, the shift amount of the cyclic shift is set to 1 (shift by 1 bit), but the shift amount is not limited to 1. In order to generate all the flip patterns without omission, the symbol number in the target block and the shift amount may be relatively prime (that is, mutually prime or co-prime values for which the only positive integer that divides evenly into both is 1).

Figure 4:
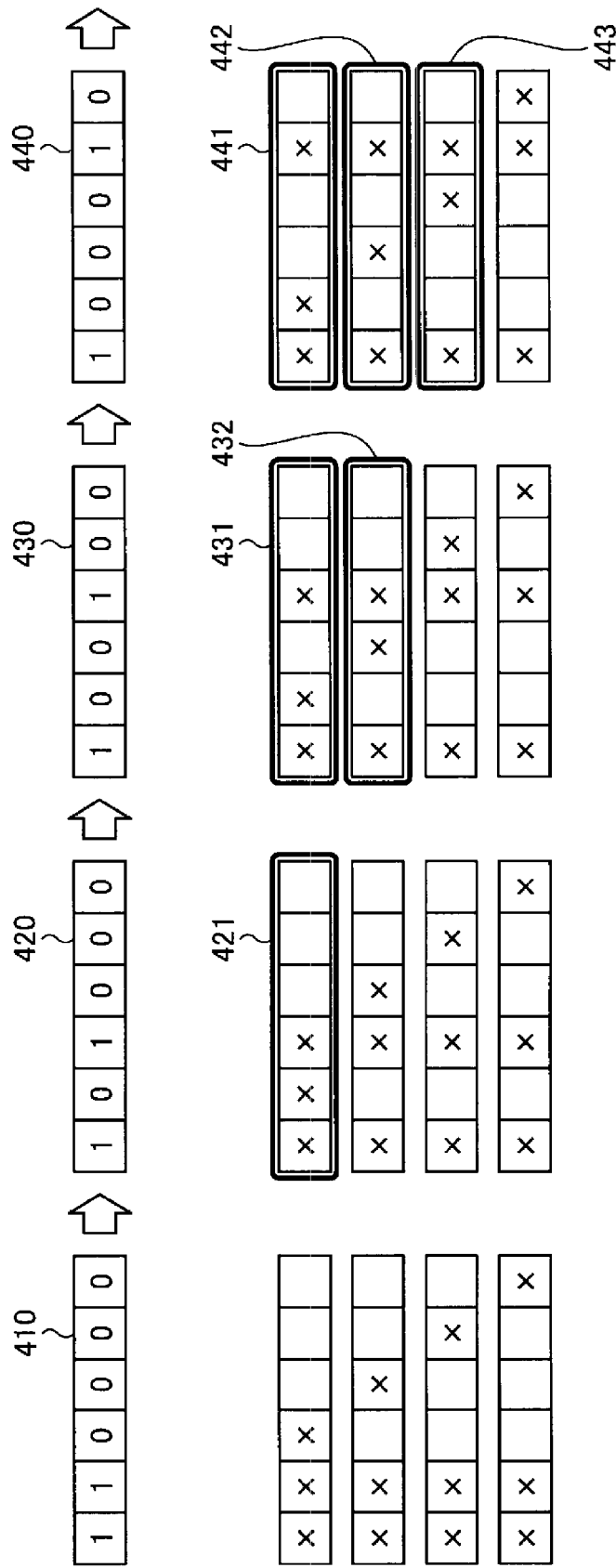
FIG. 4 depicts aspects related to a flip pattern generation method according to a comparative example.
Figure 5:
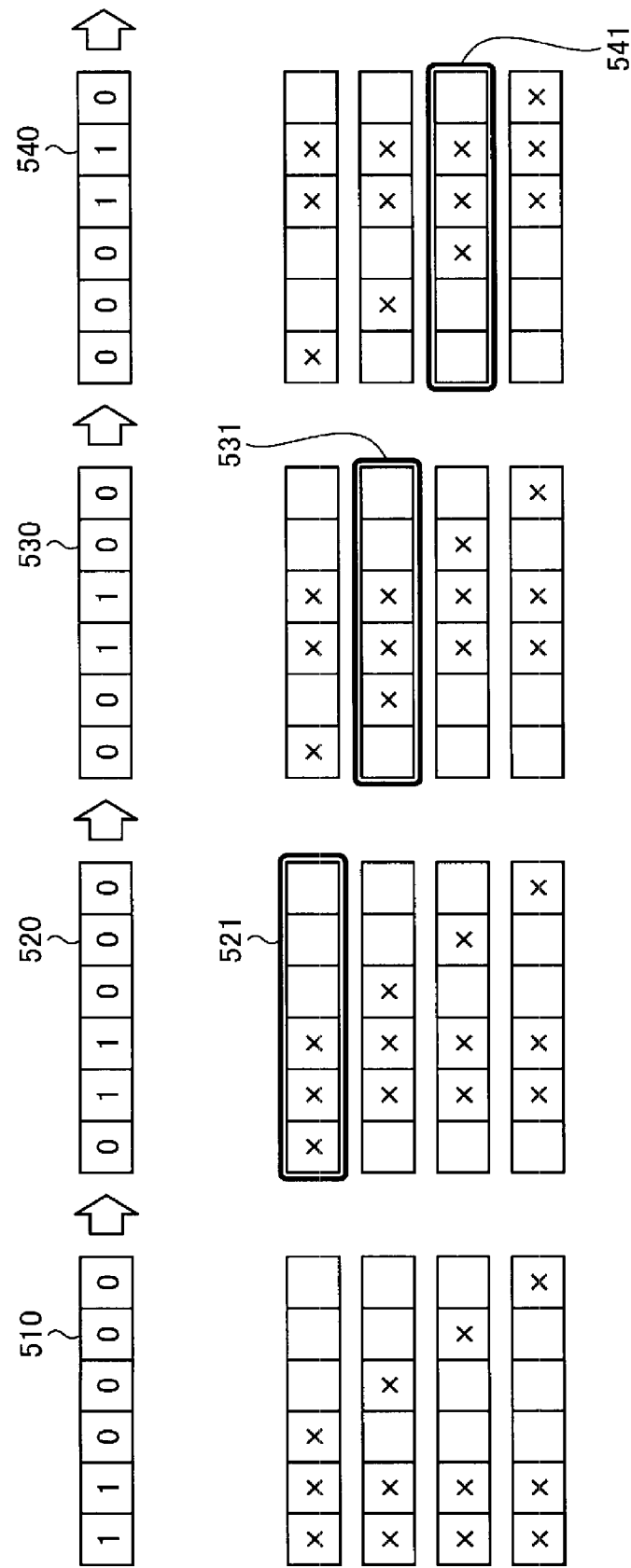
FIG. 5 depicts aspects of a flip pattern generation method according to a first embodiment.

By generating the flip pattern as in the present embodiment, it is possible to shorten the time required for successful decoding. FIG. 4 is a view illustrating an example of a flip pattern generation method according to a comparative example. FIG. 5 is a view illustrating an example of a flip pattern generation method according to the present embodiment. In FIGS. 4 and 5, a case in which the symbol number (the bit number) in the target block is 6 and the symbol number to be flipped is 2 are depicted.

A flip pattern 410 in FIG. 4 corresponds to an initial value. In this comparative example, for the two symbols to be flipped in the flip pattern 410, the position of the left symbol is fixed and the position of the right symbol is shifted to the right to sequentially generate flip patterns 420, 430, and 440. The pattern shown below each flip pattern represents an error pattern that may be corrected when flipped according to each corresponding flip pattern. The notation "x" in the error pattern represents a symbol having an error in a block.

An error pattern 421 indicates an error pattern that the flip pattern 410 and the flip pattern 420 overlap. Error patterns 431 and 432 indicate error patterns that overlap the flip patterns 410 and 420 generated before the corresponding flip pattern 430. Error patterns 441, 442, and 443 indicate error patterns that overlap the flip patterns 410, 420, and 430 generated before the corresponding flip pattern 440.

As illustrated in FIG. 4, in the comparative example, there are many overlapping error patterns among a plurality of flip patterns. This means that even though decoding is executed according to generated flip patterns, error patterns that are not successful are often unnecessarily processed.

In the flip pattern generation method of the present embodiment illustrated in FIG. 5, the number of error patterns that overlap among a plurality of flip patterns is reduced as compared to the comparative example. In the present embodiment, flip patterns 520, 530, and 540 are sequentially generated using a flip pattern 510 as an initial value according to the above procedure. Error patterns of the flip patterns 520, 530, and 540 that overlap the other flip patterns are only one of error patterns 521, 531, and 541, respectively.

In this way, by determining the position to cyclically flip to generate a flip pattern, error patterns that may be corrected are less overlapped, so that the correctable flip pattern may be searched more efficiently.

Figure 6:
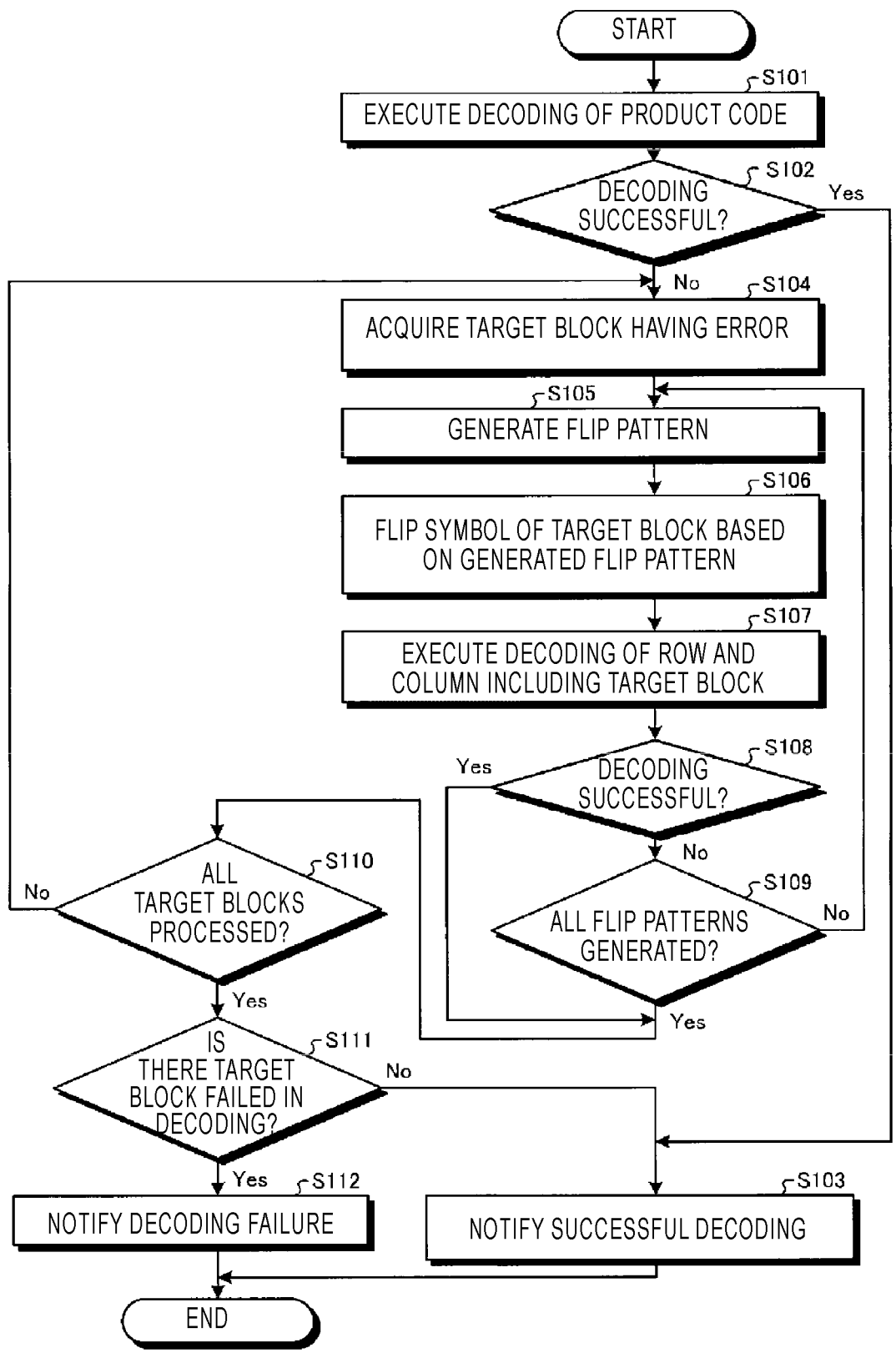
FIG. 6 is a flowchart of a decoding operation according to a first embodiment.

Next, the decoding operation according to the present embodiment will be described in detail with reference to the drawings. FIG. 6 is a flow chart illustrating a schematic example of the decoding operation according to the present embodiment.

The decoding unit 302 executes the iterative decoding process on the read information read from the nonvolatile memory 20 by the memory I/F 13 (S101). The decoding unit 302 determines whether or not the iterative decoding process succeeded (S102). For example, the decoding unit 302 repeats the iterative decoding process until the end condition is satisfied, obtains the syndrome of each component code, and determines that the iterative decoding process failed when there is a syndrome whose value is not 0.

When it is determined that the iterative decoding process is successful (Yes in S102), for example, the decoding unit 302 notifies the controller 11 of the successful decoding (S103). When it is determined that the iterative decoding process fails (No in S102), the encoding/decoding unit 14 executes MBFD, as in processes of S104 to S112 below.

First, the decoding unit 302 acquires one of blocks having an error as a target block (S104). For example, as in (S1) above, the decoding unit 302 sets one of blocks included in both a component code in the row direction in which the syndrome is not 0 and a component code in the column direction in which the syndrome is not 0, as the target block.

The sequence generator 303 generates a flip pattern (S105). In the first process, for example, the sequence generator 303 generates a flip pattern including the initial value of the flip position, as in (R1) above.

The decoding unit 302 flips the symbol of the target block based on the generated flip pattern (S106). The decoding unit 302 executes decoding of at least one of the component code in the row direction and the component code in the column direction including the target block in which the symbol is flipped (S107).

The decoding unit 302 determines whether or not the decoding is successful (S108). When it is determined that the decoding fails (No in S108), the decoding unit 302 determines whether or not all the flip patterns that may be generated are generated (S109).

All the flip patterns that may be generated mean all the flip patterns that may be generated by a decision rule used by the sequence generator 303. For example, when the symbol number in the target block and the shift amount are not relatively prime, a flip pattern that may not be generated by the decision rule may occur.

For example, when all the initial values including the first initial value (the above (R1)) and the updated initial value (the above (R3)) are subjected to the cyclic shift until they return to the initial value, the decoding unit 302 determines that all the flip patterns are generated.

When it is determined that all the flip patterns are not generated (No in S109), the process returns to S105 where the sequence generator 303 generates a new flip pattern to repeat the process. The sequence generator 303 generates a flip pattern as in (R2) and (R3) above, for example, after the second iteration.

When it is determined that all the flip patterns are generated (Yes in S109) and when it is determined that the decoding is successful in S108 (Yes in S108), the decoding unit 302 determines whether or not all the blocks having an error are processed as the target block (S110).

When it is determined that all the blocks having an error are not yet processed (No in S110), the decoding unit 302 acquires an unprocessed target block on which to repeat the process. When it is determined that all the blocks having an error are processed (Yes in S110), the decoding unit 302 determines whether or not there is a target block that failed in decoding (S111).

When it is determined that there is a target block that failed in decoding (Yes in S111), the decoding unit 302 notifies the controller 11 of the decoding failure (S112). When it is determined that there is no target block failed in decoding (No in S111), the decoding unit 302 notifies the controller 11 of the successful decoding (S103).

As described above, in the first embodiment, when the decoding including the process of flipping the value of the symbol is executed, the flip position is cyclically shifted to sequentially generate the flip pattern indicating the flip position. By using the flip pattern generated in this way, the probability of successful decoding may be improved. As a result, it is possible to reduce the decoding latency of MBFD.

Second Embodiment

In the first embodiment, an example of a memory system that executes MBFD is described as an example of decoding that flips the value of a symbol. The same function may be applied to decoding methods other than MBFD that flip the value of a symbol. In the second embodiment, an example using chase decoding will be described. The decoding method of flipping the symbol value is not limited to the chase decoding, but may be another decoding method such as OSD (Ordered Statistics Decoding).

The schematic configuration of the memory system of the second embodiment is the same as that of FIG. 1 illustrating the schematic configuration of the memory system of the first embodiment except for the function of the encoding/decoding unit. Hereinafter, an encoding/decoding unit 14-2 of the second embodiment will be described.

Figure 7:
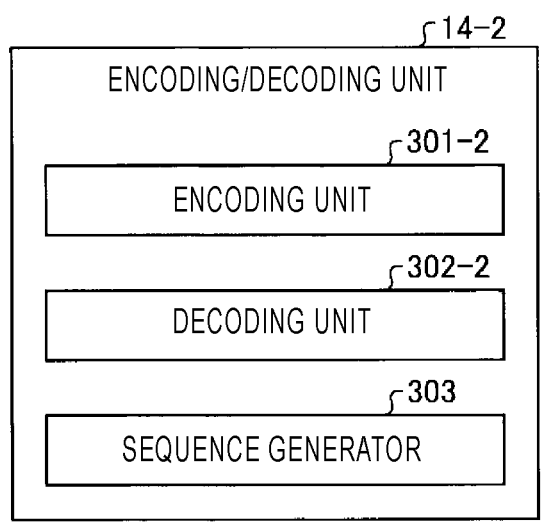
FIG. 7 is a block diagram of an encoding/decoding unit according to a second embodiment.

FIG. 7 is a block diagram illustrating an example of the functional configuration of the encoding/decoding unit 14-2 of the second embodiment. As illustrated in FIG. 7, the coding/decoding unit 14-2 includes an encoding unit 301-2, a decoding unit 302-2, and a sequence generator 303. The function of the sequence generator 303 is the same as that of the first embodiment and so is denoted by the same reference numeral, and explanation thereof will not be repeated.

The encoding unit 301-2 generates a code word to which chase decoding may be applied. For example, an encoding method used by the encoding unit 301-2 may adopt an encoding method using algebraic codes such as BCH codes and RS codes, an encoding method using these codes as component codes in the row direction and the column direction (product code or the like), and an encoding method using codes based on a sparse graph, such as LDPC codes. The encoding unit 301-2 may generate a product code using these codes as component codes.

The decoding unit 302-2 decodes data encoded with an error correction code read from the nonvolatile memory 20 by chase decoding. The decoding is executed in, for example, the following procedure:

The decoding unit 302-2 uses an LLR (Log-Likelihood Ratio) table to convert a sequence {y} of received words y read and input from the nonvolatile memory 20 into a sequence of LLR values (an example of likelihood information).

The decoding unit 302-2 generates a hard decision value sequence that is a sequence in which each element of the LLR value sequence is hard-decided. The decoding unit 302-2 generates a hard decision value sequence by associating a hard decision value with 0 when the LLR value is 0 or more and by associating the hard decision value with 1 when the LLR value is smaller than 0.

The decoding unit 302-2 determines the symbol number to flip and the range to flip (flip region) in the hard decision value sequence. Here, the decoding unit 302-2 may determine the range to flip independently for each symbol number to flip.

The decoding unit 302-2 executes the chase decoding including a process of flipping the symbol included in the flip region determined in the hard decision value sequence. At this time, the decoding unit 302-2 determines the position of the symbol to be flipped within the flip region by a flip pattern generated by the sequence generator 303.

Figure 8:
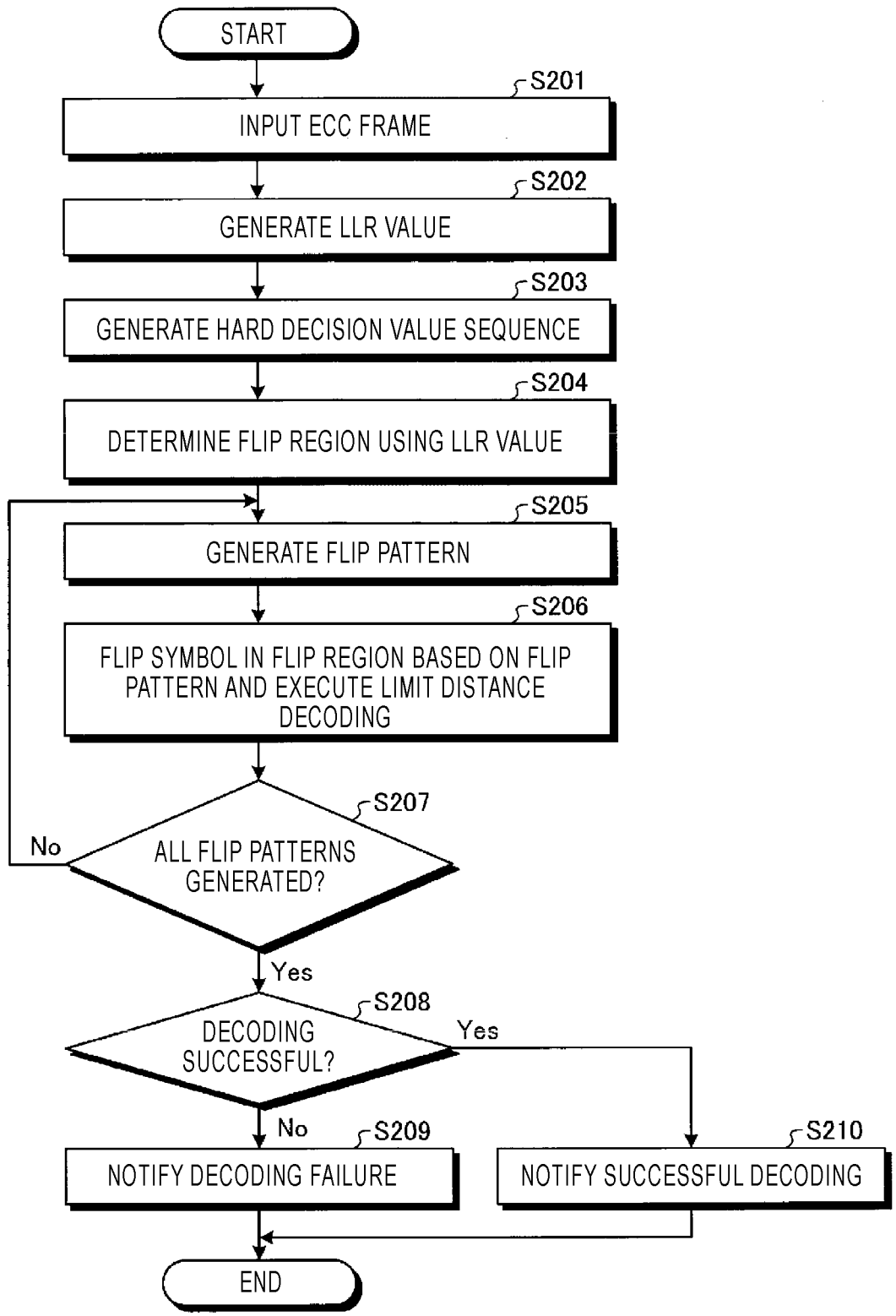
FIG. 8 is a flowchart of a decoding operation according to a second embodiment.

Next, the decoding operation according to the second embodiment will be described with reference to the drawings. FIG. 8 is a flow chart illustrating a schematic example of the decoding operation according to the second embodiment.

First, the memory I/F 13 inputs to the decoding unit 302-2 a sequence {y} of received words y in the ECC frame unit read from the nonvolatile memory 20 (S201). The ECC frame is a data block for reconstructing a code word from a sequence of received words.

The decoding unit 302-2 uses an LLR table to convert the sequence {y} of received word y into a sequence of LLR values (S202). The decoding unit 302-2 generates a hard decision value sequence that is a sequence in which each element of the LLR value sequence is hard-decided (S203). The decoding unit 302-2 determines the symbol number to flip and the range to flip (flip region) in the hard decision value sequence (S204). At this time, the decoding unit 302-2 may adjust the size of the flip region according to the LLR value of the LLR value sequence. In addition, the decoding unit 302-2 may determine the range to flip independently for each symbol number to flip.

The sequence generator 303 generates a flip pattern (S205). In the first process, for example, the sequence generator 303 generates a flip pattern including the initial value of the flip position, as in (R1) above. Here, the sequence generator 303 may include a pattern in which nothing is flipped in the flip patterns.

The decoding unit 302-2 flips a symbol in the flip region based on the generated flip pattern and executes the limit distance decoding (S206). Here, when the limit distance decoding is successful, the decoding unit 302-2 uses a decoded word, which is obtained as the decoding result, as a decoded word candidate to calculate a score according to the following procedure.

Let a set of symbol positions corrected by flip position and limit distance decoding be I={i1, i2 . . . if}. Where, f is the total number of flipped symbols.

The decoding unit 302-2 calculates the score S by the following equation (1). Where, $|LLR_j|$ is the absolute value of the j-th LLR value in the LLR value sequence.

$$S=\sum_{j=i_1}^{i_f}|LLR_j| \qquad \text{Equation 1:}$$

The decoding unit 302-2 determines whether or not all the flip patterns that may be generated are generated (S207). When it is determined that all the flip patterns are not generated (No in S207), the process returns to S205 where the sequence generator 303 generates a new flip pattern to repeat the process.

When it is determined that all the flip patterns are generated (Yes in S207), the decoding unit 302-2 determines whether the decoding is successful (S208). For example, when the number of decoded word candidates as the decoding result, which is obtained by the limit distance decoding in S206, is not 0, the decoding unit 302-2 sets the decoded word candidate with the smallest score as the maximum likelihood decoded word among the decoded word candidates and determines that the decoding is successful. When the number of decoded word candidates is 0, the decoding unit 302-2 determines that the decoding was failed. When it is determined that the decoding is successful (Yes in S208), the decoding unit 302-2 notifies the controller 11 of the decoding success (S210). The decoding unit 302-2 also outputs a sequence {k} (the maximum likelihood decoded word) of estimated value k obtained by the decoding. After that, this operation ends. In addition, the output sequence {k} is, for example, stored in the data buffer 12, restored to the user data that is the write value, and then transmitted to the host 30 that issued a read request.

If it is determined that the decoding fails (No in S208), the decoding unit 302-2 notifies the controller 11 of the decoding failure (S209). After that, this operation ends. The controller 11 transmits, for example, a read error of the requested data to the host 30 that issued the read request.

As described above, in the second embodiment, the positions of symbols to be flipped by the flip process in the chase decoding are sequentially determined using the sequence generator. Thereby, for example, it is possible to reduce the number of trials of the flip pattern until the maximum likelihood decoded word is obtained, and to improve the probability that the maximum likelihood decoded word is obtained when the number of flip patterns is fixed.

Third Embodiment

In the first and second embodiments, the example of determining the flip position when performing the decoding for flipping the value of the symbol was described. The sequence generator as described above may be applied when determining a position where the value of a parity check matrix used in decoding or encoding is 1, instead of the flip position. In the third embodiment, an example in which the sequence generator is used to generate the parity check matrix will be described.

The schematic configuration of a memory system of the third embodiment is the same as that of FIG. 1 except for the function of the encoding/decoding unit. Hereinafter, an encoding/decoding unit 14-3 of the third embodiment will be described.

Figure 9:
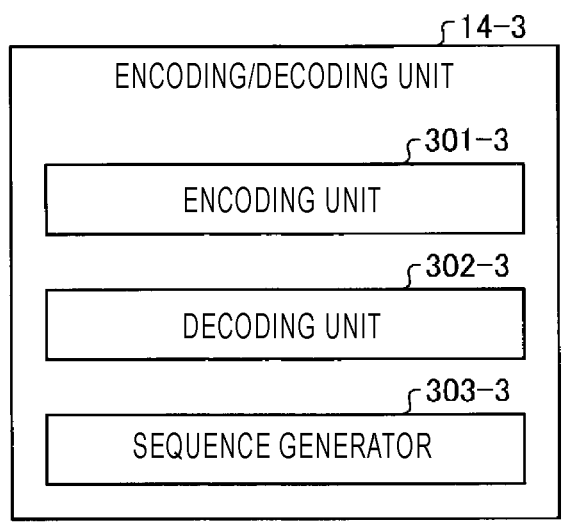
FIG. 9 is a block diagram of an encoding/decoding unit according to a third embodiment.

FIG. 9 is a block diagram illustrating an example of the functional configuration of the encoding/decoding unit 14-3 of the third embodiment. As illustrated in FIG. 9, the encoding/decoding unit 14-3 includes an encoding unit 301-3, a decoding unit 302-3, and a sequence generator 303-3.

The encoding unit 301-3 generates a code word to which a decoding method using a parity check matrix may be applied. For example, an encoding method used by the encoding unit 301-3 may adopt an encoding method using an LDPC code. The encoding unit 301-3 may generate a product code having an LDPC code as a component code.

The decoding unit 302-3 executes decoding using the parity check matrix. For example, the decoding unit 302-3 executes a parity check using the parity check matrix on the decoding result obtained by decoding a received word read from the nonvolatile memory 20.

The sequence generator 303-3 generates a sequence indicating the pattern of elements of each constituent unit of the parity check matrix. The constituent unit is a row or a column that constitutes the parity check matrix. In the following, a case where the constituent unit is a row will be described as an example. The sequence generator 303-3 generates a pattern of each row (hereinafter referred to as a row pattern) so as to generate a parity check matrix in which an element value at a position determined according to a decision rule is 1.

Generating a row pattern is equivalent to determining the position of an element whose value is 1 among elements in each row. The row pattern may be represented as, for example, a binary sequence.

The sequence generator 303-3 generates and outputs a row pattern according to, for example, the following decision rule(s).

(R1') The row pattern in the first row is determined according to the rule for determining an initial value of the position of an element whose value in the row pattern is 1.

(R2') Among the elements in the second and subsequent rows, the position of the element whose value is 1 is determined by a position obtained by cyclically shifting the initial value.

(R2') may be executed by, for example, the following procedure:

A position determined by cyclically shifting the position determined for the m-th row (m is an integer of 1 or more) is obtained.

The obtained position is compared with an initial value.

When the obtained position does not match the initial value, the obtained position is determined as the position for the (m+1)th row.

When the obtained position matches the initial value, the process ends.

For example, when the parity check matrix is a 9×9 matrix, the element number having a value of 1 in each row is 3, and the row corresponding to an initial value is "100010010", the row pattern is generated as follows.

First row: "100010010"
Second row: "010001001"
Third row: "101000100"
Fourth row: "010100010"
Fifth row: "001010001"
Sixth row: "100101000"
Seventh row: "010010100"
Eighth row: "001001010"
Ninth row: "000100101"

Figure 10:
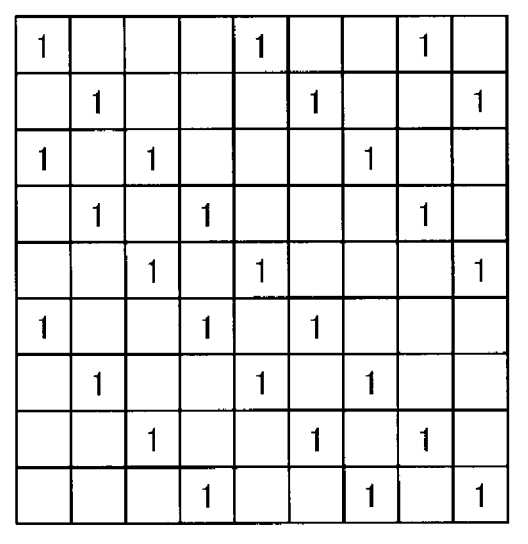

FIG. 10 is a view illustrating an example of a parity check matrix generated so as to include the row pattern generated in this way. In FIG. 10, elements having a value other than 1 (elements having a value of 0) are indicated as blank.

The decoding performance of the parity check matrix increases as a reference value called "girth" increases. For example, the value of the girth becomes larger as the positions of the elements having the value of 1 in the generated parity check matrix are more dispersed. Parameters such as the element number having a value of 1, an initial value, a shift amount of a cyclic shift, and the like may be set in advance so that the generated parity check matrix has a larger girth. The decoding performance may be improved by using the parity check matrix generated using such parameters.

In addition, the rows included in the parity check matrix may be divided into multiple sets (e.g., an odd row set and an even row set) and then parameters individually determined for each set may be used to generate a row pattern.

Figure 11:
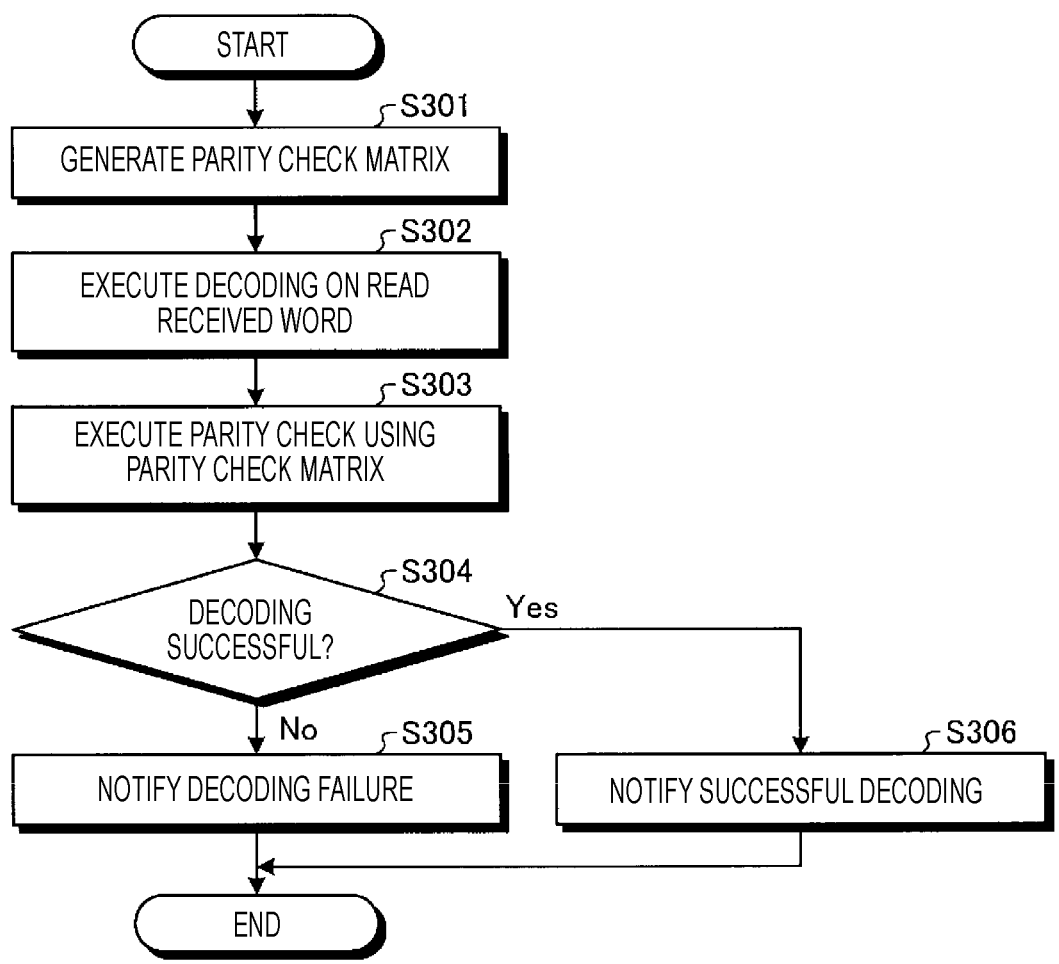
FIG. 11 is a flowchart of a decoding operation according to a third embodiment.

Next, the decoding operation according to the third embodiment will be described with reference to the drawings. FIG. 11 is a flow chart illustrating a schematic example of the decoding operation according to the present embodiment.

The sequence generator 303-3 generates a parity check matrix based on a predetermined initial value and decision rule (S301). The decoding unit 302-3 executes the decoding process on a received word read from the nonvolatile memory 20 by the memory I/F 13 (S302). The decoding unit 302-3 executes a parity check using the generated parity check matrix (S303). The decoding unit 302-3 determines whether or not the decoding succeeded, based on the result of the parity check (S304).

When it is determined that the decoding succeeded (Yes in S304), the decoding unit 302-3 notifies the controller 11 of the decoding success (S306). When it is determined that the decoding failed (No in S304), the decoding unit 302-3 notifies the controller 11 of the decoding failure (S305).

An example of generating a parity check matrix used at the time of decoding was described. When an encoding method that uses a parity check matrix at the time of encoding is used, the parity check matrix used at the time of encoding may be generated in the same manner as described above.

In an LDPC code or the like, a sparse matrix in which many elements are 0 is used as a parity check matrix. According to the third embodiment, the parity check matrix may be generated when necessary by using an initial value and the above-mentioned decision rules. Therefore, it is not necessary to store the parity check matrix in a storage unit such as the data buffer 12. That is, it is possible to reduce the size of a storage area required for the storage unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a nonvolatile memory configured to store a multidimensional error correction code in which each of a plurality of symbol groups, each of which is a set of a plurality of symbols forming a code, is encoded by both a first component code and a second component code; and
   a memory controller configured to:
   read data encoded by the multidimensional error correction code from the nonvolatile memory and execute a first decoding process using the first component code and the second component code; and
   when the first decoding process fails, execute a second decoding process on an error symbol group which includes an error according to both the first component code and the second component code, wherein
   the second decoding process includes:
      determining the positions of a plurality of symbols whose values are to be inverted from among the plurality of symbols included in the error symbol group according to a predetermined decision rule;
      inverting the values of the plurality of symbols at the determined positions; and
      performing a decoding process using at least one of the first component code and the second component code after the values are inverted, and
   the decision rule includes a rule for cyclically shifting the positions decided for the second decoding process at the m-th time in the error symbol group, where m is an integer of 1 or more, to decide the positions for the second decoding process at the (m+1)th time.

2. The memory system according to claim 1, wherein the decision rule includes:
   a rule for selecting a position initial value as a position for the second decoding process at the first time; and
   a rule for selecting a position for the second decoding process after the second time by a position obtained by cyclically shifting the initial value.

3. The memory system according to claim 2, wherein the decision rule further includes a rule for selecting a new initial value once the cyclically shifted position returns to the initial value.

4. The memory system according to claim 1, wherein the number of symbols included in the error symbol group and the shift amount of the cyclic shift are relatively prime.

5. The memory system according to claim 1, wherein the position is represented by a binary sequence that includes the same number of bits as the number of symbols included in the error symbol group, with a bit corresponding to a symbol whose value is to be inverted being set to 1 and a bit corresponding to a symbol whose value is not to be inverted being set to 0.

6. The memory system according to claim 1, wherein the position is represented by an index sequence including a plurality of indexes that respectively identify a plurality of symbols whose values are inverted among the symbols included in the error symbol group.

7. The memory system according to claim 1, wherein each of the first component code and the second component code is a BCH code or a Reed-Solomon code.

8. The memory system according to claim 1, wherein the nonvolatile memory is a NAND flash memory.

9. The memory system according to claim 1, wherein the nonvolatile memory is semiconductor memory.

10. A memory system, comprising:
a nonvolatile memory configured to store an error correction code; and
a memory controller configured to read data encoded using the error correction code from the nonvolatile memory and execute a decoding process using likelihood information calculated based on the read data, wherein
the decoding process includes:
determining a range of symbols whose values are to be inverted from among a plurality of symbols included in the read error correction code;
determining the positions of a plurality of symbols whose values are to be inverted from among the plurality of symbols included in the range according to a predetermined decision rule;
inverting the values of the plurality of symbols at the determined positions; and
performing a decoding process using the error correction code after the values are inverted, and
the decision rule includes a rule for cyclically shifting the positions decided for the decoding process at the m-th time, where m is an integer of 1 or more, in the range to decide the positions for the decoding process at the (m+1)th time.

11. The memory system according to claim 10, wherein the decision rule includes:
a rule for selecting a position initial value as a position for the decoding process at the first time; and
a rule for selecting a position for the decoding process after the second time by a position obtained by cyclically shifting the initial value.

12. The memory system according to claim 11, wherein the decision rule further includes a rule for selecting a new initial value once the cyclically shifted position returns to the initial value.

13. The memory system according to claim 10, wherein the number of symbols included in the range and the shift amount of the cyclic shift are relatively prime.

14. The memory system according to claim 10, wherein the nonvolatile memory is a NAND flash memory.

15. The memory system according to claim 10, wherein the nonvolatile memory is semiconductor memory.

* * * * *